(12) United States Patent
Kim (10) Patent No.: US 9,142,603 B2
(45) Date of Patent: Sep. 22, 2015

(54) ORGANIC LIGHT-EMITTING DIODE (OLED) DISPLAY AND METHOD OF MANUFACTURING THE SAME

(71) Applicant: Samsung Display Co., Ltd., Yongin (KR)

(72) Inventor: Su-Weon Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/308,348

(22) Filed: Jun. 18, 2014

(65) Prior Publication Data
US 2015/0228705 A1 Aug. 13, 2015

(30) Foreign Application Priority Data
Feb. 12, 2014 (KR) ........................ 10-2014-0016286

(51) Int. Cl.
*H01L 27/32* (2006.01)
*H01L 51/56* (2006.01)
*H01L 27/12* (2006.01)

(52) U.S. Cl.
CPC ........ *H01L 27/3276* (2013.01); *H01L 27/1259* (2013.01); *H01L 27/322* (2013.01); *H01L 27/3246* (2013.01); *H01L 27/3248* (2013.01); *H01L 51/56* (2013.01); *H01L 2227/323* (2013.01)

(58) Field of Classification Search
CPC ............ H01L 27/3276; H01L 27/3246; H01L 27/1259; H01L 27/322; H01L 27/3248; H01L 51/56; H01L 2227/323
See application file for complete search history.

(56) References Cited

U.S. PATENT DOCUMENTS

| 7,164,228 | B2 | 1/2007 | Karasawa et al. | |
|---|---|---|---|---|
| 7,911,131 | B2 | 3/2011 | Kim et al. | |
| 8,022,900 | B2 | 9/2011 | Koh et al. | |
| 8,253,128 | B2 | 8/2012 | Kim et al. | |
| 8,362,469 | B2 | 1/2013 | Suh | |
| 8,368,299 | B2 | 2/2013 | Kim et al. | |
| 8,953,128 | B2 * | 2/2015 | Lee et al. | 349/139 |
| 2008/0024479 | A1 | 1/2008 | Jung et al. | |
| 2014/0342478 | A1 * | 11/2014 | Choi | 438/23 |
| 2015/0118806 | A1 * | 4/2015 | Lee et al. | 438/158 |

FOREIGN PATENT DOCUMENTS

| JP | 2004-103334 A | 4/2004 |
|---|---|---|
| JP | 2012-160388 A | 8/2012 |
| JP | 2013-213873 A | 10/2013 |
| KR | 10-0490536 B1 | 5/2005 |
| KR | 10-0544122 B1 | 1/2006 |
| KR | 10-0570993 B1 | 4/2006 |
| KR | 10-0573134 B1 | 4/2006 |
| KR | 10-0742374 B1 | 7/2007 |
| KR | 10-0810645 B1 | 2/2008 |
| KR | 10-0846599 B1 | 7/2008 |
| KR | 10-0910013 B1 | 7/2009 |
| KR | 10-2009-0128301 A | 12/2009 |
| KR | 10-2013-0027914 A | 3/2013 |

* cited by examiner

*Primary Examiner* — Anne Hines
(74) *Attorney, Agent, or Firm* — Knobbe Martens Olson & Bear LLP (57) ABSTRACT

An organic light-emitting diode (OLED) display and a method of manufacturing the same are disclosed. In one aspect, the OLED display comprises a driving thin-film transistor (TFT), a data line electrically connected to the driving TFT and having a first color, an OLED, and a light absorption layer. The OLED is electrically connected to the driving TFT. The light absorption layer is formed over the data line and has a second color different from the first color.

15 Claims, 8 Drawing Sheets

ORGANIC LIGHT-EMITTING DIODE (OLED) DISPLAY AND METHOD OF MANUFACTURING THE SAME

RELATED APPLICATIONS

This application claims the benefit of Korean Patent Application No. 10-2014-0016286, filed on Feb. 12, 2014, in the Korean Intellectual Property Office, the disclosure of which is incorporated herein in its entirety by reference.

BACKGROUND

1. Field

The described technology generally relates to an organic light-emitting diode (OLED) display and a method of manufacturing the same.

2. Description of the Related Technology

An organic light-emitting diode (OLED) display includes an organic light-emitting diode (OLED) display including a hole injection electrode, an electron injection electrode, and an organic emission layer formed therebetween, and is a self-emission type display apparatus that emits light as excitons, which are generated when holes injected from the hole injection electrode and electrons injected from the electron injection electrode combine in the organic emission layer.

Because an OLED display is a self-emission type display apparatus and does not need a separate light source, it can be driven with a low voltage and can be lightweight and thin. In addition, because of an excellent viewing angle, contrast, and response speed, the applications of OLED display technology are expanding from a personal mobile device, such as an MP3 player or a mobile phone, to a television (TV).

SUMMARY OF CERTAIN INVENTIVE ASPECTS

One inventive aspect is an organic light-emitting diode (OLED) display and a method of manufacturing the same.

In another aspect, an OLED display includes: a gate line; a data line crossing the gate line and having a first color; a switching thin-film transistor electrically connected to the gate line and the data line; a driving thin-film transistor electrically connected to the switching thin-film transistor; an organic light-emitting device electrically connected to the driving thin-film transistor and including a pixel electrode, an intermediate layer formed on the pixel electrode and including an organic emission layer, and a counter electrode formed on the intermediate layer; and a light absorption layer formed in a region overlapping the data line in plan view, and having a second color different from the first color.

The first and second colors can be substantially complementary colors.

The data line can include a metal layer and a metal oxide layer formed on the metal layer.

The metal layer and the metal oxide layer can be respectively a titanium (Ti) layer and a titanium oxide (TiOx) layer.

The driving thin-film transistor can include a source electrode and a drain electrode, which are formed on a same layer and formed of a same material as the data line, wherein the source and drain electrodes can have the first color.

The light absorption layer can operate as a pixel-defining film that covers both edges of the pixel electrode and defines a pixel region.

The OLED display can further include a color filter formed to correspond to the organic light-emitting device in a direction in which light emitted from the intermediate layer is emitted, wherein the light absorption layer can be formed on a same layer as the color filter.

In another aspect, a method of manufacturing an organic light-emitting diode (OLED) display apparatus, the method includes: forming a gate line on a substrate; forming a data line that crosses the gate line and has a first color; and forming a light absorption layer having a second color different from the first color, in a region on the data line overlapping the data line in plan view.

The first and second colors can be substantially complementary colors.

The forming of the data line can include: forming a metal layer; oxidizing at least a portion of the metal layer via an anodic oxidation method using an electrolyte, resulting in an oxidized portion of the metal layer; and patterning the metal layer which is oxidized at least a portion.

The metal layer can include titanium (Ti).

The method can further include forming a driving thin-film transistor including source and drain electrodes having the first color, wherein the source and drain electrodes can be formed simultaneously with the data line.

The method can further include forming an organic light-emitting device electrically connected to the driving thin-film transistor, wherein the forming of the organic light-emitting device can include: forming a pixel electrode; forming an intermediate layer including an organic emission layer; and forming a counter electrode.

The forming of the light absorption layer can include, after the forming of the pixel electrode, forming the light absorption layer operating as a pixel-defining film that covers both edges of the pixel electrode and defines a pixel region.

The method can further include forming a color filter to correspond to the organic light-emitting device in a direction in which light emitted from the intermediate layer is emitted, wherein the light absorption layer and the color filter can be formed on a same layer.

Another aspect is an organic light-emitting diode (OLED) display, comprising a gate line, a data line crossing the gate line and having a first color, a switching thin-film transistor (TFT) electrically connected to the gate line and the data line, a driving TFT electrically connected to the switching TFT, an organic light-emitting diode (OLED), and a light absorption layer. The OLED is electrically connected to the driving TFT and comprises i) a pixel electrode, ii) an intermediate layer formed over the pixel electrode and including an organic emission layer, and iii) a counter electrode formed over the intermediate layer. The light absorption layer is formed in a region at least partially overlapping the data line in plan view, and having a second color different from the first color.

In the above OLED display, the first and second colors are substantially complementary to each other.

In the above OLED display, the data line comprises a metal layer and a metal oxide layer formed on the metal layer. In the above OLED display, the metal layer and the metal oxide layer are respectively a titanium (Ti) layer and a titanium oxide (TiOx) layer.

In the above OLED display, the driving TFT comprises a source electrode and a drain electrode formed on the same layer and formed of the same material as that of the data line, wherein the source and drain electrodes have the first color.

In the above OLED display, the light absorption layer includes a pixel-defining film that at least partially covers opposing ends of the pixel electrode and defines a pixel region.

The above OLED further comprises a color filter formed over the OLED, wherein the light absorption layer is formed on the same layer as that of the color filter.

Another aspect is a method of manufacturing an organic light-emitting diode (OLED) display, the method comprising forming a gate line over a substrate, forming a data line that crosses the gate line and has a first color, and forming a light absorption layer in a region on the data line at least partially overlapping the data line in plan view, wherein the light absorption layer has a second color different from the first color.

In the above method, the first and second colors are substantially complementary to each other.

In the above method, the forming of the data line comprises forming a metal layer, oxidizing at least a portion of the metal layer with an electrolyte so as to form an oxidized portion of the metal layer, and patterning the metal layer including the oxidized portion. In the above method, the metal layer is formed of titanium (Ti).

The above method further comprises forming a driving thin-film transistor (TFT) comprising source and drain electrodes having the first color, wherein the source and drain electrodes are formed substantially simultaneously with the data line. The above method further comprises forming an OLED electrically connected to the driving TFT. In the above method, the forming of the OLED comprises forming a pixel electrode, forming an intermediate layer comprising an organic emission layer over the pixel electrode, and forming a counter electrode over the intermediate layer. In the above method, the light absorption layer includes a pixel-defining film that at least partially covers opposing ends of the pixel electrode and defines a pixel region.

The above method further comprises forming a color filter over the OLED, wherein the light absorption layer and the color filter are formed on the same layer.

Another aspect is an organic light-emitting diode (OLED) display comprising a driving thin-film transistor (TFT), a data line electrically connected to the driving TFT and having a first color, an organic light-emitting diode (OLED) electrically connected to the driving TFT, and a light absorption layer formed over the data line and having a second color different from the first color.

In the above OLED display, the first and second colors are substantially complementary to each other.

In the above OLED display, the driving TFT comprises a source electrode and a drain electrode formed on the same layer and formed of the same material as that of the data line, wherein the source and drain electrodes have the first color.

In the above OLED display, the OLED comprises a pixel electrode, wherein the light absorption layer includes a pixel-defining film that at least partially covers opposing ends of the pixel electrode and defines a pixel region.

The above OLED display further comprises a color filter formed over the OLED, wherein the light absorption layer is formed on the same layer as that of the color filter.

DETAILED DESCRIPTION OF CERTAIN INVENTIVE EMBODIMENTS

Hereinafter, the described technology will be described more fully with reference to the accompanying drawings, in which exemplary embodiments of the described technology are shown. The described technology can, however, be embodied in many different forms and should not be construed as being limited to the embodiments set forth herein; rather, these embodiments are provided so that this disclosure will be thorough and complete, and will fully convey the concept of the described technology to those skilled in the art.

In the drawings, like reference numerals denote like elements, and overlapping descriptions are omitted.

In the specification, the terms such as "first", "second", etc., do not have limited meanings, but are used only to distinguish one component from another.

An expression used in the singular encompasses the expression of the plural, unless the expression used in the singular has a clearly different meaning in the context.

In the present specification, it is to be understood that the terms such as "including" or "having," etc., are intended to indicate the existence of the features or components, and are not intended to preclude the possibility that one or more other features or components can exist or can be added.

It will also be understood that when a part such as a film, a region, or a component is referred to as being "on" another part, it can be directly on the other part, or intervening film, region, or component can also be present.

In drawings, the sizes of components can be exaggerated for clarity. For example, because the sizes and thicknesses of components are arbitrarily illustrated for convenience of description, embodiments of the present described technology are not limited by the drawings.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed on" can also mean "formed over."

Figure 1:
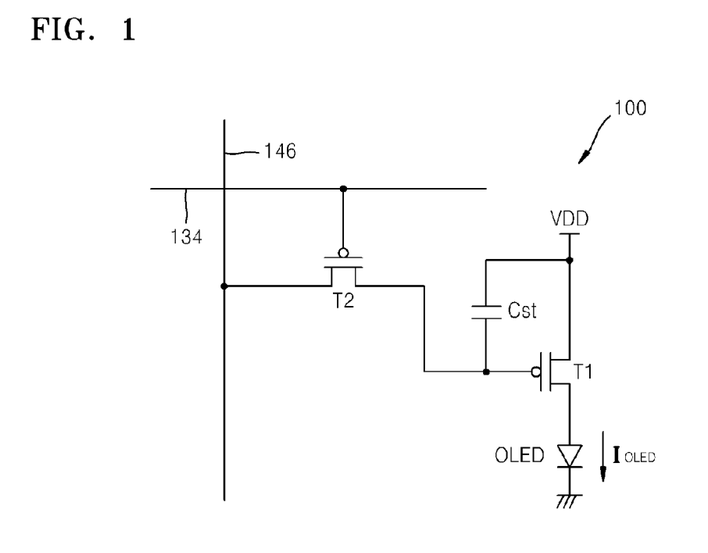
FIG. 1 is a circuit diagram schematically illustrating a pixel circuit of an organic light-emitting diode (OLED) display according to an embodiment.
Figure 2:
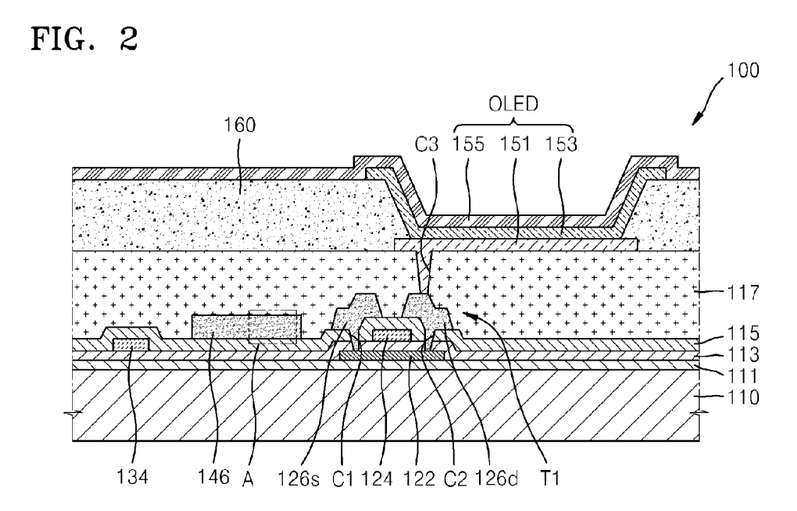
FIG. 2 is a cross-sectional view schematically illustrating an OLED display according to an embodiment.
Figure 3:
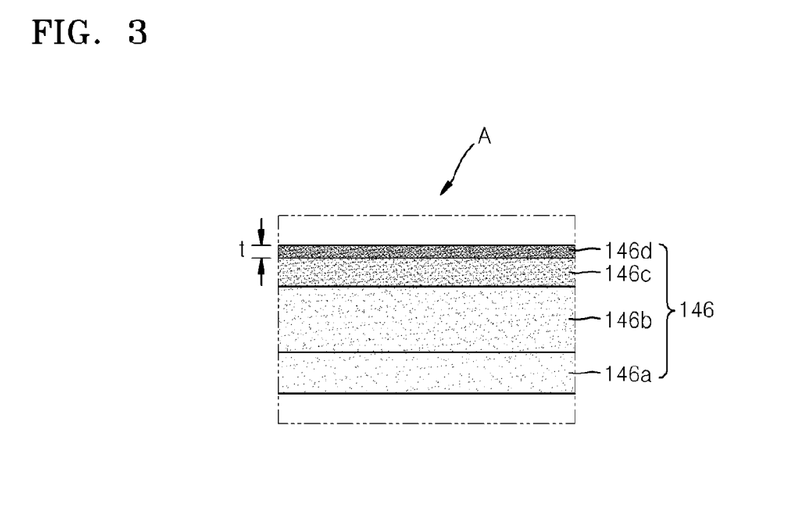
FIG. 3 is a cross-sectional view of a region A of FIG. 2.

FIG. 1 is a circuit diagram schematically illustrating a pixel circuit of an OLED display 100 according to an embodiment. FIG. 2 is a cross-sectional view schematically illustrating the OLED display 100 according to an embodiment. FIG. 3 is a cross-sectional view of a region A of FIG. 2.

Referring to FIG. 1, the OLED display 100 includes a gate line 134, a data line 146 crossing the gate line 134 and having a first color, a switching thin-film transistor (TFT) T2 electrically connected to the gate line 134 and the data line 146, a driving TFT T1 electrically connected to the switching TFT T2, an organic light-emitting diode (OLED) electrically connected to the driving TFT T1, and a light absorption layer 160 (FIG. 2) formed in a region overlapping the data line 146 in plan view and having a second color different from the first color.

Referring to driving principles of the OLED display 100, the switching TFT T2 is turned on by a selection signal transmitted through the gate line 134. A data voltage is transmitted to a gate terminal of the driving TFT T1 through the data line 146 when the switching TFT T2 is turned on. A potential difference between the data voltage and a voltage source VDD is stored in a capacitor Cst connected between a gate and a source of the driving TFT T1. A driving current $I_{OLED}$ flows to the OLED due to the potential difference, and thus the OLED emits light. In some embodiments, a predetermined contrast gray scale can be displayed according to a voltage level of an applied data voltage.

FIG. 1 shows an active matrix (AM) type OLED display having a 2Tr-1Cap structure, wherein the pixel circuit includes two TFTs, i.e., the driving TFT T1 and the switching TFT T2, and one capacitor Cst, but the described technology is not limited thereto. In other words, an OLED display can include a plurality of TFTs and at least one capacitor in one pixel circuit, and can be formed to have any one of various structures. For example, a separate wire can be further included or an existing wire can be omitted. In some embodiments, a pixel circuit is a minimum unit for displaying an image, and a display apparatus displays an image by using a plurality of pixel circuits.

Referring to FIGS. 2 and 3, a buffer layer 111 can be formed on a substrate 110 that is a glass substrate or a plastic substrate. The buffer layer 111 can block impure elements from penetrating through the substrate 110, can flatten a surface of the substrate 110, and can include a single layer or plurality of layers formed of an inorganic material, such as silicon nitride ($SiN_x$) and/or silicon oxide ($SiO_x$).

The driving TFT T1 can be formed in a region on the buffer layer 111. The driving TFT T1 can include an active layer 122, a gate electrode 124, a source electrode 126s, and a drain electrode 126d. A gate insulating film 113 can be formed between the active layer 122 and the gate electrode 124, and an interlayer insulating film 115 can be formed between the gate electrode 124 and the source and drain electrodes 126s and 126d.

In FIG. 2, the driving TFT T1 is a top gate type TFT in which the gate electrode 124 is formed above the active layer 122, but alternatively, the driving TFT T1 can be a bottom gate type TFT in which the gate electrode 124 is formed below the active layer 122.

The active layer 122 can be formed of an inorganic semiconductor material, such as amorphous silicon or crystalline silicon. The gate electrode 124 can include a single layer or plurality of layers formed of at least one material from among aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu). The gate electrode 124 can be formed on the same layer and formed of the same material as the gate line 134.

The source and drain electrodes 126s and 126d can have the first color, and can be electrically connected to the active layer 122 respectively through first and second contact holes C1 and C2 formed in the interlayer insulating film 115 and the gate insulating film 113. The source and drain electrodes 126s and 126d can be formed on the same layer and can include the same material as the data line 146, which will be described in detail later.

The gate line 134 is formed in another region on the buffer layer 111, and the gate insulating film 113 can be formed between the buffer layer 111 and the gate line 134.

The gate line 134 can be formed on the same layer and be formed of the same material as that of the gate electrode 124. In other words, the gate line 134 can include a single layer or plurality of layers formed of at least one of Al, Pt, Pd, Ag, Mg, Au, Ni, Nd, Jr, Cr, Li, Ca, Mo, Ti, W, and Cu.

The data line 146 can be formed in another region on the buffer layer 111. The gate insulating film 113 and the interlayer insulating film 115 can be formed between the buffer layer 111 and the data line 146. Although not shown, the gate line 134 and the data line 146 can include regions that overlap in plan view, and can be insulated from each other by the interlayer insulating film 115.

The data line 146 has the first color, and the first color can be a chromatic color, such as blue, yellow, or green, instead of a black- or white-based color. When a data line has a white-based color, visibility of an OLED display can be low because external light incident on the data line is reflected. When the data line has a black-based color, the data line can absorb a laser beam emitted while manufacturing the OLED display and thus a metal forming the data line can melt.

However, the data line 146, according to the current embodiment, has a chromatic color instead of a white- or black-based color. When viewed together with the light absorption layer 160 by a user, the data line 146 can be appeared to be in a black-based color, which will be described later.

Referring to FIG. 3, the data line 146 can include a plurality of layers, and can include a low resistance metal layer 146b formed of Al or Cu The data line 146 can include first and second protection metal layers 146a and 146c respectively formed below and on the low resistance metal layer 146b.

The first and second protection metal layers 146a and 146c can include Ti. A metal oxide layer 146d having a thickness t can be formed on the second protection metal layer 146c.

The metal oxide layer 146d can be formed of titanium oxide ($TiO_x$). The data line 146 can have various colors based on the thickness t of the metal oxide layer 146d, as will be described later.

As described above, the source and drain electrodes 126s and 126d can be formed of the same material as that of the data line 146, can include Ti and $TiO_x$, and can also have the first color, like the data line 146.

Referring back to FIG. 2, a planarization film 117 can be formed on the interlayer insulating film 115 to at least partially cover the data line 146, the source electrode 126s, and the drain electrode 126d. The OLED including a pixel electrode 151, an intermediate layer 153 including an organic emission layer, and a counter electrode 155 can be formed on the planarization film 117.

The planarization film 117 can include a via hole C3, and the drain electrode 126d and the pixel electrode 151 can be electrically connected to each other through the via hole C3.

The pixel electrode 151 can be a reflection electrode including a reflection layer. For example, the reflection layer can be formed of at least one material selected from the group consisting of Ag, Mg, Al, Pt, Pd, Au, Ni, Nd, Jr, and Cr. A transparent or semi-transparent electrode layer formed of at least one material selected from the group consisting of indium tin oxide (ITO), indium zinc oxide (IZO), zinc oxide (ZnO), indium oxide ($In_2O_3$), indium gallium oxide, and aluminum zinc oxide (AZO) can be further formed on the reflection layer.

For example, the pixel electrode 151 can include three layers: ITO, Ag, and ITO.

The intermediate layer 153 can include the organic emission layer, and can further include at least one of a hole injection layer (HIL), a hole transport layer (HTL), an electron transport layer (ETL), and an electron injection layer (EIL). However, the described technology is not limited thereto, and the intermediate layer 153 can further include other various functional layers, as well as the organic emission layer.

Meanwhile, when the OLED is a full color OLED display, the organic emission layer can be patterned to include a red emission layer, a green emission layer, and a blue emission layer respectively according to a red sub-pixel, a green sub-pixel, and a blue sub-pixel.

Meanwhile, the organic emission layer can have a multi-layer structure in which a red emission layer, a green emission layer, and a blue emission layer are stacked to emit a white light, or a single layer structure including a red emission material, a green emission material, and a blue emission material. The OLED including such an organic emission layer can additionally include a red color filter, a green color filter, and a blue color filter to emit a full color.

The counter electrode 155 can be a transparent or semi-transparent electrode, can be formed of at least one material selected from among Ag, Al, Mg, Li, Ca, Cu, LiF/Ca, LiF/Al, MgAg, and CaAg, and can have a thickness from several nanometers (nm) to tens of nanometers (nm).

The OLED display 100 of FIG. 1 can be a top-emission type OLED display that emits a light towards the counter electrode 155 because the pixel electrode 151 is a reflection electrode and the counter electrode 155 is a transparent or semi-transparent electrode.

The light absorption layer 160 at least partially covering two edges or opposing ends of the pixel electrode 151 can be formed on the planarization film 117. In the some embodiments, the light absorption layer 160 can operate as a pixel-defining film for defining a pixel region. The light absorption layer 160 can be formed of an organic material having the second color, or an organic material including a pigment having the second color.

The light absorption layer 160 can have the second color different from the first color, and the first and second colors can be complementary colors. In other words, when the first and second colors are mixed, brightness can be decreased and the mixture of first and second colors can substantially have a black-based color.

The data line 146 and the light absorption layer 160 are formed in regions overlapping each other in plan view. The overlapping regions can substantially appear to be black when viewed by the user.

Accordingly, light corresponding to a partial wavelength of a visible ray area of external light incident on the OLED display 100 can be absorbed by the light absorption layer 160, and light corresponding to the remaining wavelength can be absorbed by the data line 146.

In other words, the OLED display 100 can have improved visibility by reducing the amount of external light reflected by a metal layer, such as the data line 146 included in the OLED display 100.

FIGS. 4A through 4I are cross-sectional views for describing a method of manufacturing the OLED display 100 of FIG. 2.

Figure 4A:
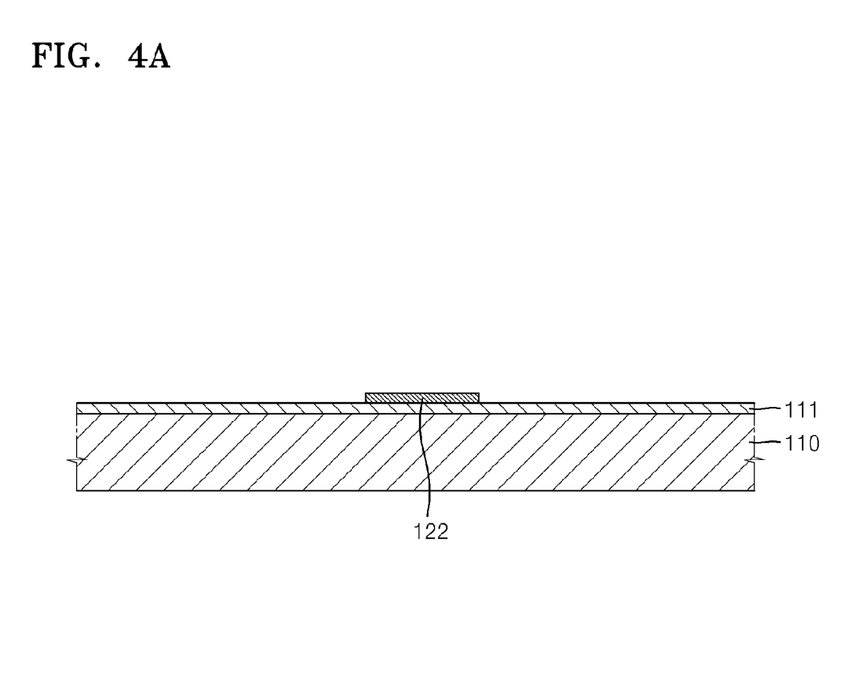
FIGS. 4A through 4I are cross-sectional views for describing a method of manufacturing the OLED display of FIG. 2.

Referring to FIG. 4A, the buffer layer 111 can be formed on the substrate 110, and then the active layer 122 can be formed on the buffer layer 111. The buffer layer 111 can include a single layer or plurality of layers formed of an inorganic material, such as $SiN_x$ and/or $SiO_x$. The active layer 122 can be formed of an inorganic semiconductor material, such as amorphous silicon or crystalline silicon.

Figure 4B:
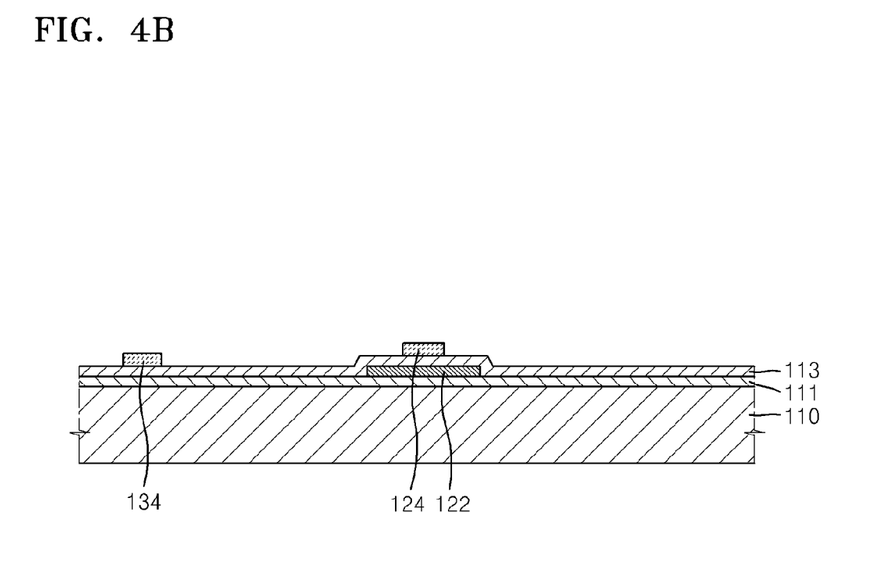

Referring to FIG. 4B, the gate insulating film 113 can be formed to at least partially cover the active layer 122 on the buffer layer 111. The gate line 134 and the gate electrode 124 can be formed on the gate insulating film 113.

The gate insulating film 113 can be formed of an inorganic material, such as $SiO_2$, $SiN_x$, SiON, $Al_2O_3$, $TiO_2$, $Ta_2O_5$, $HfO_2$, $ZrO_2$, BST, or PZT The gate line 134 and the gate electrode 124 can include a single layer or multiple layers formed of at least one material from among Al, Pt, Pd, Ag, Mg, Au, Ni, Nd, Ir, Cr, Li, Ca, Mo, Ti, W, and Cu.

Although not illustrated, the gate line 134 and the gate electrode 124 can be substantially simultaneously formed by coating a conductive material, and then sequentially performing photoresist coating, exposing light, developing, etching, and striping by using a mask corresponding to a desired pattern.

Figure 4C:
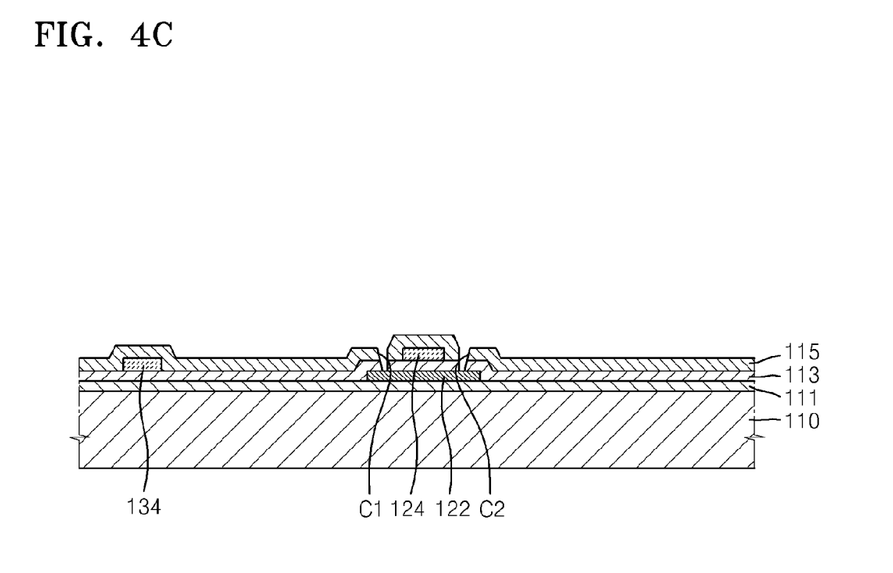

Referring to FIG. 4C, the interlayer insulating film 115 can be formed to at least partially cover the gate line 134 and the gate electrode 124. The first and second contact holes C1 and C2 exposing parts of two edges of the active layer 122 can be formed at the interlayer insulating film 115 and the gate insulating film 113.

Figure 4D:
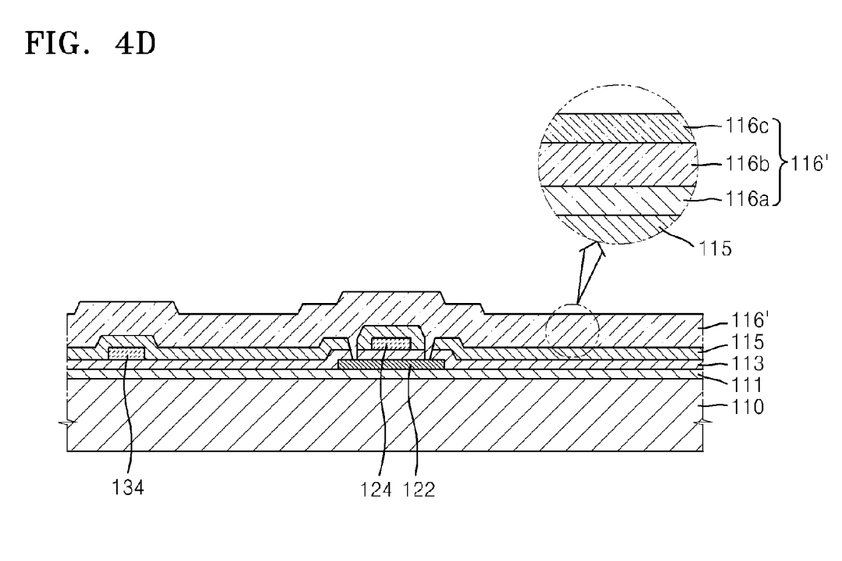

Referring to FIG. 4D, a metal layer 116' can be formed on the interlayer insulating film 115. The metal layer 116' can include a low resistance metal layer 116b and first and second protection metal layers 116a and 116c respectively formed below and on the low resistance metal layer 116b. The low resistance metal layer 116b can be formed of Al or Cu, and the first and second protection metal layers 116a and 116c can be formed of Ti.

Figure 4E:
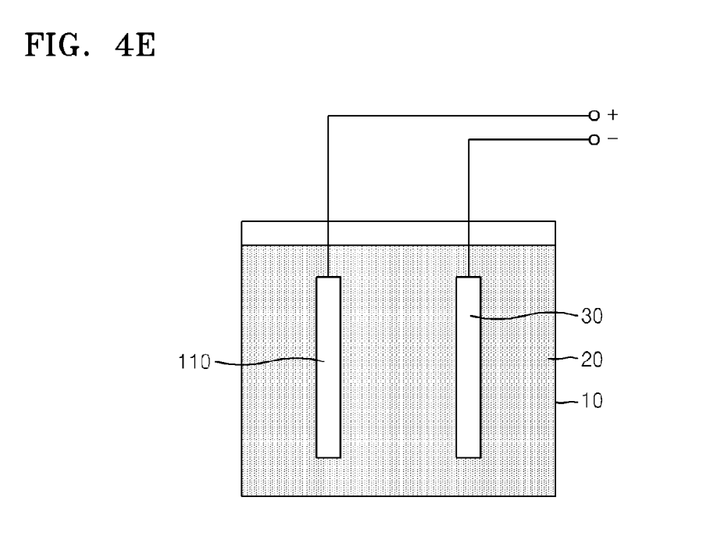
Figure 4F:
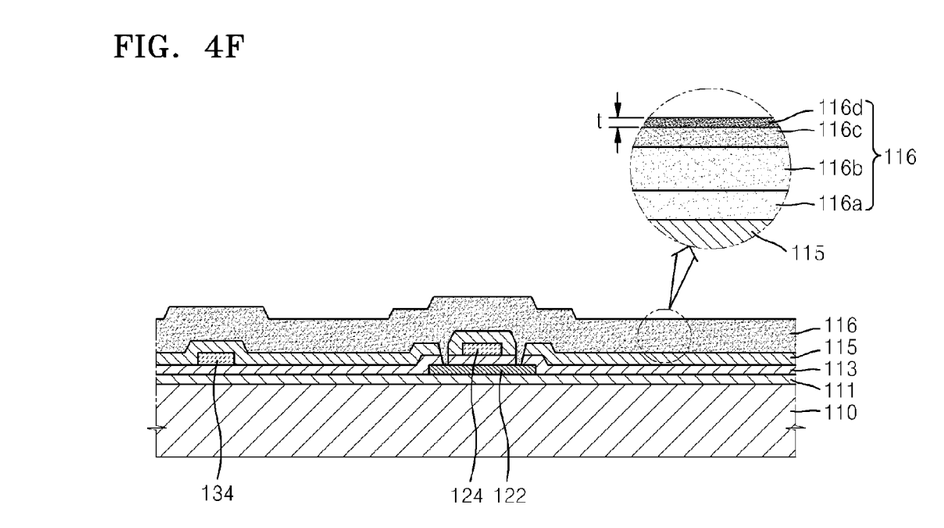

Referring to FIGS. 4E and 4F, the substrate 110, on which the metal layer 116' of FIG. 4D, etc. are formed, are put into a container 10 accommodating an electrolyte 20. The metal layer 116' can be oxidized by using the metal layer 116' as a positive electrode. In other words, the metal layer 116' can be oxidized via an anodic oxidation method.

A negative electrode material 30, as well as the substrate 110, can be formed in the electrolyte 20 The electrolyte 20 can be a liquid in which water and an acidic solution, such as ammonium sulfate, copper sulfate, or sodium carbonate, are mixed. However, the electrolyte 20 is not limited thereto, and any acidic solution can be used as the electrolyte 20.

According to the anodic oxidation method, the second protection metal layer 116c that is an uppermost layer in the metal layer 116' is oxidized, and thus a metal oxide layer 116d is formed.

In other words, an oxidized metal layer 116 can include the low resistance metal layer 116b, the first and second protection metal layers 116a and 116c respectively formed on and below the low resistance metal layer 116b, and the metal oxide layer 116d formed on the second protection metal layer 116c. The metal oxide layer 116d can be $TiO_x$ generated as Ti is oxidized, and can have the thickness t.

The thickness t of $TiO_x$ can vary according to a voltage applied to the electrolyte 20, i.e., according to a potential difference between the metal layer 116' and the negative electrode material 30. A color of the oxidized metal layer 116 can vary according to the thickness t. As the voltage applied to the electrolyte 20 is increased, the oxidized metal layer 116 can have a color such as yellow, purple, blue, magenta, or green.

Figure 4G:
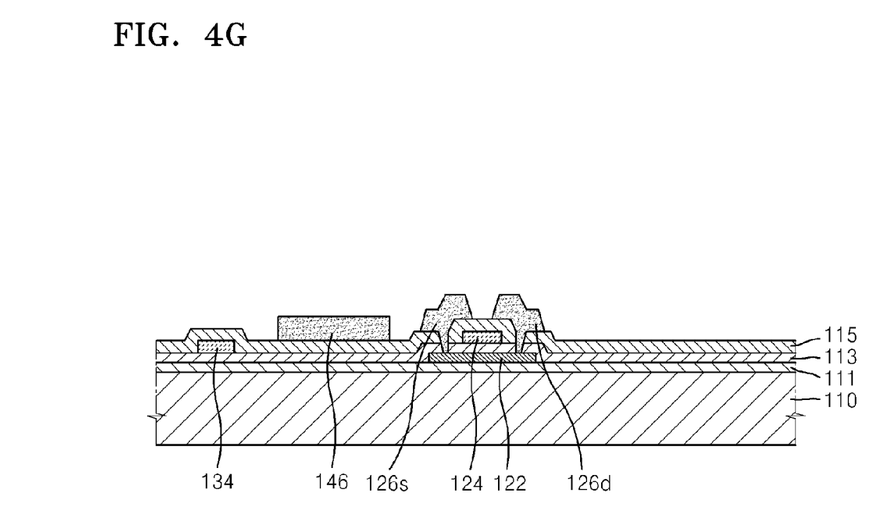

Referring to FIG. 4G, the oxidized metal layer 116 of FIG. 4F can be patterned to substantially simultaneously form the data line 146, the source electrode 126s, and the drain electrode 126d.

In other words, the data line 146, the source electrode 126s, and the drain electrode 126d can have a predetermined color, i.e., the first color, according to the thickness t of $TiO_x$, as described above.

Figure 4H:
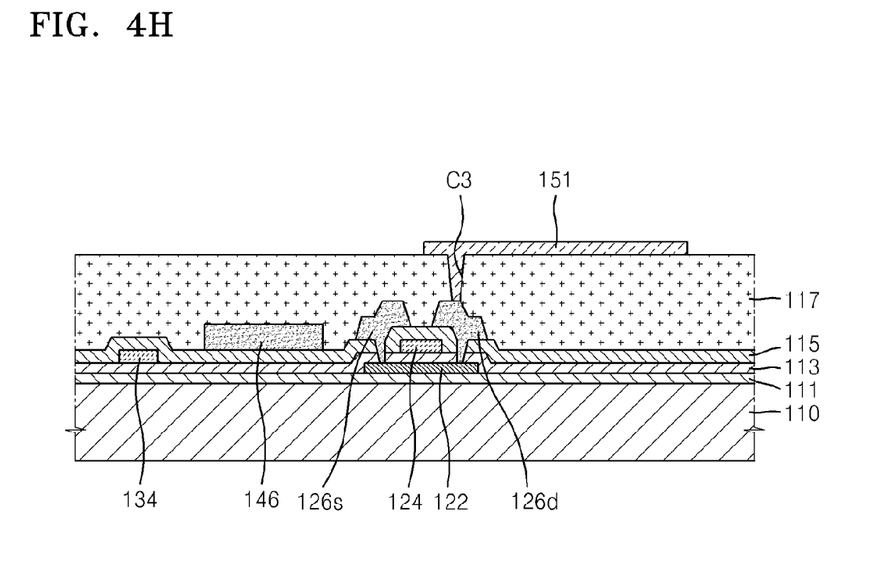

Referring to FIG. 4H, the planarization film 117 can be formed to at least partially cover the data line 146, the source electrode 126s, and the drain electrode 126d on the interlayer insulating film 115. The via hole C3 can be formed on the planarization film 117. The planarization film 117 can be formed of an organic material having excellent planarization characteristics.

After forming the via hole C3, the pixel electrode 151 electrically connected to the drain electrode 126d through the via hole C3 can be formed on the planarization film 117.

Figure 4I:
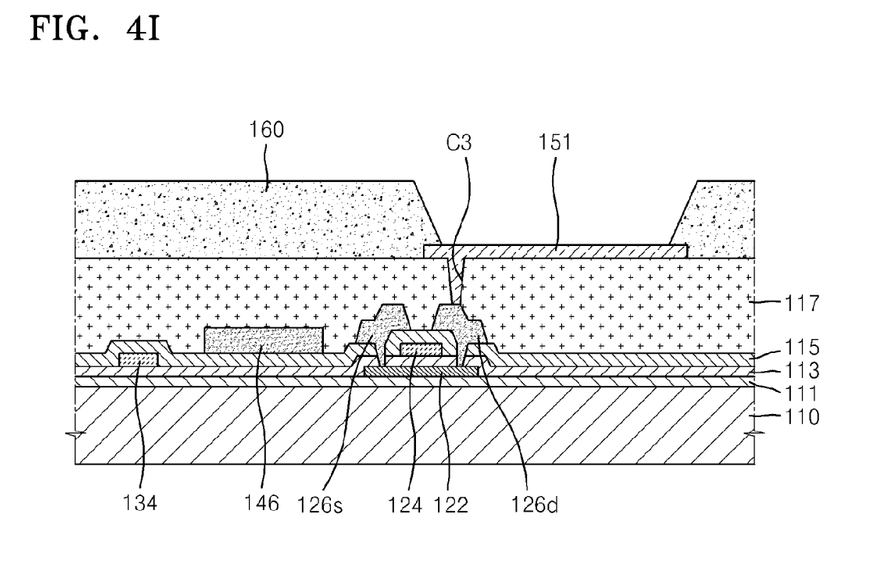

Referring to FIG. 4I, after forming the pixel electrode 151, the light absorption layer 160 can be formed.

The light absorption layer 160 can be formed of an organic material having the second color, or an organic material including a pigment having the second color.

The light absorption layer 160 can have the second color different from the first color, and the first and second colors can be complementary colors. In other words, when the first and second colors are mixed, brightness can be decreased and the mixture of first and second colors can substantially have a black-based color.

The data line 146 and the light absorption layer 160 are formed in regions overlapping each other in plan view. The overlapping regions can substantially appear to be black when viewed by the user.

Referring back to FIG. 2, the intermediate layer 153 and the counter electrode 155 can be formed on the pixel electrode 151.

Figure 5:
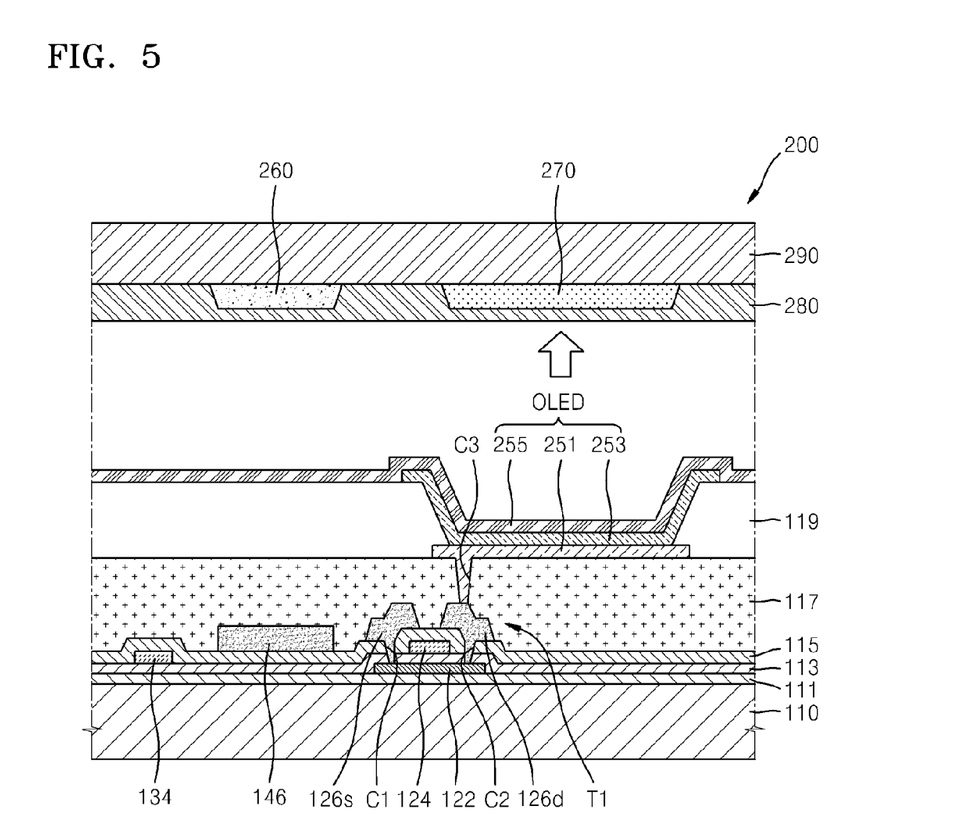
FIG. 5 is a cross-sectional view schematically illustrating an OLED display according to another embodiment.

FIG. 5 is a cross-sectional view schematically illustrating an OLED display 200 according to another embodiment.

Like reference numerals in FIGS. 2 and 5 denote like elements, and differences between the OLED display 100 of FIG. 2 and the OLED display 200 of FIG. 5 will now be mainly described.

Referring to FIG. 5, the OLED display 200 according to the current embodiment includes the buffer layer 111 formed on the substrate 110. The driving TFT T1, the gate line 134, and the data line 146 can be formed on the buffer layer 111.

The driving TFT T1 can include the active layer 122, the gate electrode 124, the source electrode 126s, and the drain electrode 126d. The gate insulating film 113 can be formed between the active layer 122 and the gate electrode 124. The interlayer insulating film 115 can be formed between the gate electrode 124 and the source and drain electrodes 126s and 126d.

The gate line 134 can be formed on the same layer and formed of the same material as the gate electrode 124. The data line 146 can be formed on the same layer and formed of the same material as the source and drain electrodes 126s and 126d.

The data line 146, the source electrode 126s, and the drain electrode 126d can have the first color, and include a metal layer formed of Ti and a metal oxide layer formed of $TiO_x$.

The first color can be a chromatic color instead of a white- or black-based color, and can appear to be a black-based color together with a light absorption layer 260 described later, when viewed by the user.

The planarization film 117 can be formed on the interlayer insulating film 115 to at least partially cover the data line 146, the source electrode 126s, and the drain electrode 126d. The OLED including a pixel electrode 251, an intermediate layer 253 including an organic emission layer, and a counter electrode 255 can be formed on the planarization film 117. The planarization film 117 can include the via hole C3. The drain electrode 126d and the pixel electrode 251 can be electrically connected to each other through the via hole C3.

The pixel electrode 251 can be a reflection electrode including a reflection layer, the counter electrode 155 can be a transparent or semi-transparent electrode, and the intermediate layer 253 can include the organic emission layer and further include at least one of an HIL, an HTL, an ETL, and an EIL. However, the described technology is not limited thereto, and the intermediate layer 253 can further include other various functional layers, as well as the organic emission layer.

The organic emission layer can have a multilayer structure in which a red emission layer, a green emission layer, and a blue emission layer are stacked to emit a white light, or can have a single layer structure formed of a red emission material, a green emission material, and a blue emission material.

A pixel-defining film 219 at least partially covering two edges of the pixel electrode 251 can be formed on the planarization film 117. The pixel-defining film 219 can be formed of an organic material, such as polyimide.

The OLED display 200 can include an encapsulation substrate 290. The light absorption layer 260 and a color filter 270 can be formed on a surface of the encapsulation substrate 290, which faces the substrate 110.

The color filter 270 can be formed to correspond to the OLED in a direction in which light emitted from the intermediate layer 253 is emitted. The color filter 270 can be any one of a red color filter, a green color filter and a blue color filter. In other words, the intermediate layer 253 can emit a white light and realize a color with the color filter 270.

FIG. 5 illustrates one sub-pixel of the OLED display 200. Each pixel of the OLED display 200 can include a plurality of sub-pixels.

The light absorption layer 260 can be formed on the same layer as the color filter 270, and can be formed to substantially overlap the data line 146 in plan view. The light absorption layer 260 can have the second color different from the first color, and the first and second colors can be complementary colors. In other words, when the first and second colors are mixed, brightness can be decreased and the mixture of first and second colors can substantially have a black-based color.

The light absorption layer 260 can have the same color as the color filter 270, and in this case, the color filter 270 and the light absorption layer 260 can be formed of the same material, and can be formed substantially simultaneously.

In other words, a coating of a material for forming the light absorption layer 260 and a coating of a material for forming the color filter 270 can be applied to the encapsulation substrate 290. The light absorption layer 260 and the color filter 270 can be substantially simultaneously formed via a patterning process.

When the light absorption layer 260 and the color filter 270 are formed of different materials, a coating of a material for forming the color filter 270 can be applied to the encapsulation substrate 290 and patterned to form the color filter 270. A coating of a material for forming the light absorption layer 260 can be applied to the encapsulation substrate 290 and patterned to form the light absorption layer 260. The light absorption layer 260 can be formed and then the color filter 270 can be formed.

An overcoat film 280 can be formed on the encapsulation substrate 290 to cover the light absorption layer 260 and the color filter 270. although not illustrated, a black matrix (not shown) can be further formed between the light absorption layer 260 and the color filter 270.

In FIG. 5, a width of the light absorption layer 260 is the same as that of the data line 146, but alternatively, the light absorption layer 260 can extend to a region beyond a region where the color filter 270 is formed.

The data line 146 and the light absorption layer 260 can be formed in regions overlapping each other in plan view, and can substantially appear to be black when viewed by the user.

Accordingly, light corresponding to a partial wavelength of a visible ray area of external light incident on the OLED display 200 can be absorbed by the light absorption layer 260, and light corresponding to the remaining wavelength can be absorbed by the data line 146.

In other words, the OLED display 200 can have improved visibility by reducing the amount of external light reflected by a metal layer, such as the data line 146 included in the OLED display 200.

Figure 6:
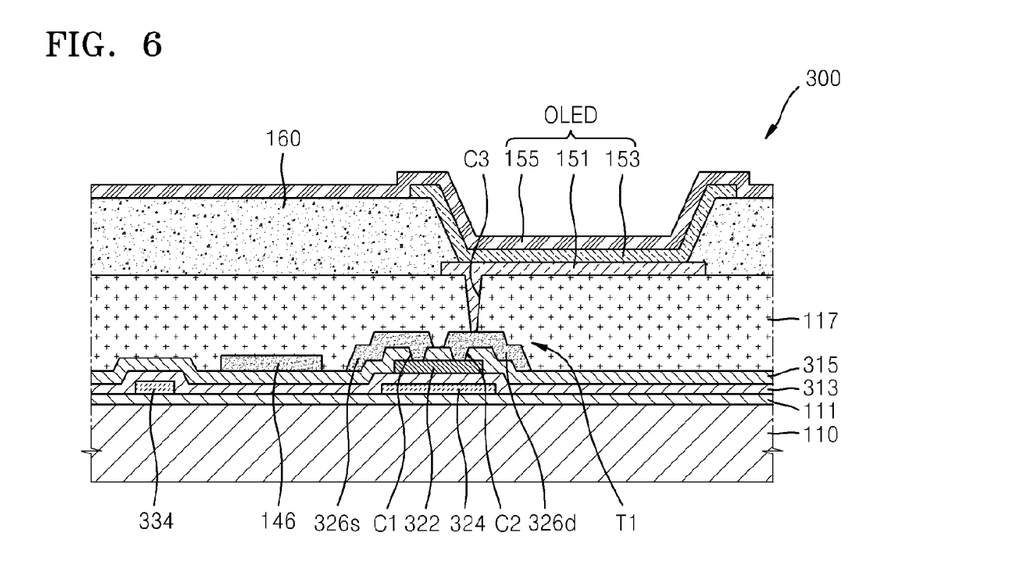
FIG. 6 is a cross-sectional view schematically illustrating an OLED display according to another embodiment.

FIG. 6 is a cross-sectional view schematically illustrating an OLED display 300 according to another embodiment.

Like reference numerals in FIGS. 2 and 6 denote like elements, and differences between the OLED display 100 of FIG. 2 and the OLED display 300 of FIG. 6 will now be mainly described.

Referring to FIG. 6, the OLED display 300 according to the current embodiment includes the buffer layer 111 formed on the substrate 110. The driving TFT T1, a gate line 334, and the data line 146 can be formed on the buffer layer 111.

The driving TFT T1 is a bottom gate type TFT, and includes a gate electrode 324, an active layer 322, and source and drain electrodes 326s and 326d electrically connected to the active layer 322. In some embodiments, a gate insulating film 313 can be formed between the gate electrode 324 and the active layer 322, and an etch stop layer 315 can be formed between the active layer 322 and the source and drain electrodes 326s and 326d.

The gate electrode 324 is formed below the active layer 322, and can be formed of at least one metal selected from among Al, Pt, Pd, Ag, Mg, Au, Ni, Nd, Jr, Cr, Li, Ca, Mo, Ti, W, and Cu.

The active layer 322 can be formed of an oxide semiconductor. When an active layer is formed of amorphous silicon, mobility of electrons is low and thus it is difficult to realize a driving circuit that operates at a high speed. When an active layer is formed of polysilicon, mobility of electrons is high but a threshold voltage is not uniform, and thus a separate compensation circuit can be used. Accordingly, the OLED display 300 of FIG. 6 can use an oxide semiconductor as the active layer 322.

For example, the active layer 322 can include at least any one of indium gallium zinc oxide (IGZO) and indium tin zinc oxide (ITZO), and can have a thickness of about 500 Å. Alternatively, the active layer 322 can be formed of an oxide of a material selected from among 12, 13, and 14-group metal elements, such as Zn, In, Ga, Sn, Cd, Ge, and Hf, and a combination thereof.

The etch stop layer 315 formed on the active layer 322 can protect the active layer 322 while the source and drain electrodes 326s and 326d are formed. The etch stop layer 315 and the active layer 322 can be formed of materials having different etch selectivities. In some embodiments, a difference in etch selectivities means that the active layer 322 and the etch stop layer 315 have different etch rates such that the active layer 322 is not etched while the etch stop layer 315 is etched. For example, the etch stop layer 315 can be formed of a material, such as $SiN_x$ or $AlO_x$, which has a low amount of hydrogen, and thereby does not affect an oxide characteristic of the active layer 322. The etch stop layer 315 can include the first and second contact holes C1 and C2 exposing parts of the active layer 322.

The source and drain electrodes 326s and 326d, which are electrically connected to the active layer 322 respectively through the first and second contact holes C1 and C2, can be formed on the etch stop layer 315.

The gate line 334 can be formed on the same layer and formed of the same material as the gate electrode 324. The data line 146 can be formed on the same layer and formed of the same material as the source and drain electrodes 326s and 326d.

The data line 146, the source electrode 326s, and the drain electrode 326d can have the first color, and can include a metal layer formed of Ti and a metal oxide layer formed of $TiO_x$.

The first color can be a chromatic color instead of a white- or black-based color, and can appear to be a black-based color together with the light absorption layer 160, when viewed by the user.

The planarization film 117 can be formed on the etch stop layer 315 to cover the data line 146, the source electrode 326s, and the drain electrode 326d. The OLED including the pixel electrode 151, the intermediate layer 153 including an organic emission layer, and the counter electrode 155 can be formed on the planarization film 117. The planarization film 117 can include the via hole C3. The drain electrode 326d and the pixel electrode 151 can be electrically connected to each other through the via hole C3.

The light absorption layer 160 can be formed on the planarization film 117. The light absorption layer 160 according to the current embodiment can operate as a pixel-defining film for defining a pixel region. The light absorption layer 160 can be formed of an organic material having the second color, or an organic material including a pigment having the second color.

The light absorption layer 160 can have the second color different from the first color, and the first and second colors can be complementary colors. In other words, when the first and second colors are mixed, brightness can be decreased and the mixture of first and second colors can substantially have a black-based color.

The data line 146 and the light absorption layer 160 are formed in regions overlapping each other in plan view, and the overlapping regions can appear to be black when viewed by the user.

The OLED displays 100 through 300 according to the embodiments include the data line 146 having the first color. The OLED displays 100 through 300 also include light absorption layers 160 and 260 formed in a region overlapping the data line 146 in plan view and having the second color. The data line 146 and the light absorption layers 160 and 260 can prevent the reflection of external light. Thus, visibilities of the OLED displays 100 through 300 can be improved.

The inventive technology has been described with reference to the figures, it will be understood by those of ordinary skill in the art that various changes in form and details can be made therein without departing from the spirit and scope of the present invention as defined by the following claims.

What is claimed is:

1. An organic light-emitting diode (OLED) display, comprising:
   a gate line;
   a data line crossing the gate line and having a first color;
   a switching thin-film transistor (TFT) electrically connected to the gate line and the data line;
   a driving TFT electrically connected to the switching TFT;
   an organic light-emitting diode (OLED) electrically connected to the driving TFT and comprising i) a pixel electrode, ii) an intermediate layer formed over the pixel electrode and including an organic emission layer, and iii) a counter electrode formed over the intermediate layer; and
   a light absorption layer formed in a region at least partially overlapping the data line in plan view, and having a second color different from the first color.

2. The OLED display of claim 1, wherein the first and second colors are substantially complementary to each other.

3. The OLED display of claim 1, wherein the data line comprises a metal layer and a metal oxide layer formed on the metal layer.

4. The OLED display of claim 3, wherein the metal layer and the metal oxide layer are respectively a titanium (Ti) layer and a titanium oxide (TiOx) layer.

5. The OLED display of claim 1, wherein the driving TFT comprises a source electrode and a drain electrode formed on the same layer and formed of the same material as that of the data line, and wherein the source and drain electrodes have the first color.

6. The OLED display of claim 1, wherein the light absorption layer includes a pixel-defining film that at least partially covers opposing ends of the pixel electrode and defines a pixel region.

7. The OLED display of claim 1, further comprising a color filter formed over the OLED, wherein the light absorption layer is formed on the same layer as that of the color filter.

8. A method of manufacturing an organic light-emitting diode (OLED) display, the method comprising:
   forming a gate line over a substrate;
   forming a data line that crosses the gate line and has a first color; and
   forming a light absorption layer in a region on the data line at least partially overlapping the data line in plan view, wherein the light absorption layer has a second color different from the first color.

9. The method of claim 8, wherein the first and second colors are substantially complementary to each other.

10. The method of claim 8, wherein the forming of the data line comprises:
    forming a metal layer;
    oxidizing at least a portion of the metal layer with an electrolyte so as to form an oxidized portion of the metal layer; and
    patterning the metal layer including the oxidized portion.

11. The method of claim 10, wherein the metal layer is formed of titanium (Ti).

12. The method of claim 8, further comprising forming a driving thin-film transistor (TFT) comprising source and drain electrodes having the first color, wherein the source and drain electrodes are formed substantially simultaneously with the data line.

13. The method of claim 12, further comprising forming an OLED electrically connected to the driving TFT,
    wherein the forming of the OLED comprises:
    forming a pixel electrode;
    forming an intermediate layer comprising an organic emission layer over the pixel electrode; and
    forming a counter electrode over the intermediate layer.

14. The method of claim 13, wherein the light absorption layer includes a pixel-defining film that at least partially covers opposing ends of the pixel electrode and defines a pixel region.

15. The method of claim 13, further comprising forming a color filter over the OLED, wherein the light absorption layer and the color filter are formed on the same layer.

* * * * *